United States Patent
Park et al.

(10) Patent No.: US 7,379,342 B2
(45) Date of Patent: May 27, 2008

(54) FLASH MEMORY DEVICE BEING PROGRAMMED AND VERIFIED USING VOLTAGE HIGHER THAN TARGET/READ THRESHOLD VOLTAGE TO ACHIEVE UNIFORM THRESHOLD VOLTAGE CHARACTERISTIC

(75) Inventors: Seong Je Park, Suwon-si (KR); Seung Ho Chang, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 98 days.

(21) Appl. No.: 11/304,433

(22) Filed: Dec. 14, 2005

(65) Prior Publication Data

US 2006/0268620 A1 Nov. 30, 2006

(30) Foreign Application Priority Data

May 27, 2005 (KR) ...................... 10-2005-0045177

(51) Int. Cl.
*G11C 11/34* (2006.01)
(52) U.S. Cl. ................................ 365/185.22; 365/185.2
(58) Field of Classification Search ............ 365/185.18, 365/185.19, 185.2 X, 185.22 O, 185.2, 185.22
See application file for complete search history.

(56) References Cited

U.S. PATENT DOCUMENTS

| | | | |
|---|---|---|---|
| 5,172,338 A | 12/1992 | Mehrotra et al. | |
| 6,040,996 A * | 3/2000 | Kong | ..................... 365/185.19 |
| 7,023,735 B2 * | 4/2006 | Ban et al. | ................. 365/185.2 |

OTHER PUBLICATIONS

Suh et al., "TA 7.5: A 3.3V 32 Mb NAND Flash Memory with Incremental Step Pulse Programming Scheme," IEEE International Solid State Circuits Conference, pp. 128-130 (Feb. 16, 1995).

* cited by examiner

*Primary Examiner*—VanThu Nguyen
(74) *Attorney, Agent, or Firm*—Townsend and Townsend and Crew LLP

(57) ABSTRACT

A program operation and a program verification operation are repeatedly performed. The program verification operation is performed on memory cells including pass cells to obtain a uniform distribution characteristic of a threshold voltage. Furthermore, the program verification operation is performed with a compare voltage being set higher than a target voltage initially so that a threshold voltage of a memory cell is sufficiently higher than the target voltage. The program verification operation is again performed lowering the compare voltage according to the repetition number. Thus, normally programmed cells are prevented from being again excessively programmed.

13 Claims, 3 Drawing Sheets

FLASH MEMORY DEVICE BEING PROGRAMMED AND VERIFIED USING VOLTAGE HIGHER THAN TARGET/READ THRESHOLD VOLTAGE TO ACHIEVE UNIFORM THRESHOLD VOLTAGE CHARACTERISTIC

BACKGROUND

1. Field of the Invention

The present invention relates to a method of programming a flash memory device, and more specifically, to a method of programming a flash memory device in which the reliability of a program operation and a uniform threshold voltage characteristic after the program operation can be obtained.

2. Discussion of Related Art

A flash memory device is a storage device for storing data and has a characteristic that data are retained without being eased although the supply of power is stopped. For this reason, the flash memory device has been used as a data storage device of electronic products such as mobile phones, PDAs, and MP3 players. There is a trend that the demand for flash memory devices rapidly increases.

Generally, the flash memory device is largely classified into a NOR-type flash memory device and a NAND-type flash memory device. They are common in that data are stored through a program operation and are erased through an erase operation. At this time, if the program operation is performed, a threshold voltage of a flash memory cell rises. On the contrary, if the erase operation is carried out, the threshold voltage of the flash memory cell lowers. For example, in the NAND-type flash memory device, if the program operation is performed, the threshold voltage of the flash memory cell is increased higher than 0V. If the erase operation is performed, the threshold voltage is lowered lower than 0V.

Meanwhile, data stored in the memory cell can be confirmed through a read operation.

As such, the NOR-type flash memory device and the NAND-type flash memory device have the same basic operation. Although they have the same operation, operating voltages applied to flash memory cells have different levels. Hereinafter, for convenience of explanation, a case where the program operation is performed in the NAND-type flash memory device will be described in detail.

FIG. 1 is a flowchart illustrating steps embodying a method of programming a flash memory device in the related art.

Referring to FIG. 1, the method of programming the flash memory device in the related art includes a data input step (S110), a program operation step (S120), a program verify step (S130), a program operation re-execution step (S140), and a program verify re-execution step (S150). These steps will be described below in detail.

In the data input step (S110), data to be stored in a memory cell are input to a memory device. To be more specific, the data are stored in latch means included in a page buffer of the flash memory device. The page buffer is an element included in the NAND-type flash memory device and is well known in the art. Detailed description on the construction and operation of the page buffer will be omitted.

In the program operation step (S120), the data stored in the page buffer are stored in the memory cell. At this time, in the case of the NAND-type flash memory device, the program operation is performed on a page basis and a threshold voltage of the programmed memory cell is higher than 0V. In the same manner, how the program operation is performed on a page basis is well known in the art. Detailed description thereof will be omitted. Meanwhile, the program operation is performed with data stored in the memory cell being all erased. It is common that the erase operation is usually performed before the program operation.

In the program verify step (S130), whether the data are normally stored in the memory cell by means of the program operation is verified. At this time, the verify operation compares the threshold voltage of the programmed memory cell and a compare voltage (e.g., 1V). If the threshold voltage of the programmed memory cell is higher than the compare voltage, it is determined that the program operation has been successfully performed.

To the contrary, if the threshold voltage of the programmed memory cell is lower than the compare voltage, it is determined that the program operation has not been successfully performed. If the program operation of the entire memory cells is normally performed (or has been successful), the program operation ends.

In the program operation re-execution step (S140), the program operation is performed again on memory cells on which the program operation has not been normally performed (or has not been successfully performed).

In the program verify re-execution step (S150), whether data have been normally stored in memory cells on which the program operation is performed again is verified.

If the program operation of the entire memory cells has been normally performed, the program operation is completed. If not, the program operation re-execution step (S140) and the program verify re-execution step (S150) are repeatedly performed until the program operation of the entire memory cells is normally completed.

The aforementioned program operation is not again performed on the memory cell on which the operation is normally performed. Therefore, there exist memory cells which have a threshold voltage higher than a target voltage but may not be sufficiently high for the memory cells that are normally programmed. In this case, if the threshold voltage is varied as times goes or due to the influence of the operation of peripheral memory cells, the threshold voltage can become lower than the target voltage and data stored in the memory cell can be changed. Furthermore, a threshold voltage of memory cells on which several program operations are performed becomes sufficiently higher than a target voltage. Therefore, there is a disadvantage in that the level of an overall threshold voltage becomes irregular. Due to this, there is a problem in that the reliability of the program operation is lowered.

SUMMARY OF THE INVENTION

An advantage of the present invention is a method of programming a flash memory device in which after a program operation is completed, a program verify operation is repeatedly performed wherein a threshold voltage of a programmed memory cell is also detected, and if there are memory cells whose threshold voltage becomes low as a result of the detection, the program operation is again performed on corresponding memory cells, thereby obtaining a uniform distribution characteristic of a threshold voltage.

Furthermore, a program verify operation is performed with a compare voltage being set higher than a target voltage initially, so that a threshold voltage of a memory cell is sufficiently higher than the target voltage. The program verify operation is again performed while lowering the compare voltage according to the repetition number. It is thus possible to prevent normally programmed cells from being again excessively programmed.

In a method of programming a flash memory device according to an embodiment of the present invention, a memory cell is programmed by repeatedly performing a program operation and a program verify operation. In this case, a program verify operation is performed on the entire memory cells including memory cells on which the program operation has been normally performed in the program verify operation.

In the above, the program operation can be repeatedly performed while raising a program voltage applied to the memory cell. At this time, the program voltage can rise from 16.5V to 19.5V. Further, the program voltage can increase by 0.2V to 0.5V according to the program operation number.

In the program verify operation, a compare voltage used to determine a threshold voltage level of the memory cell can be set higher than a target threshold voltage, and the program verify operation can be repeatedly performed while lowering the compare voltage up to the target threshold voltage. At this time, the compare voltage can fall from 1.15V to 1.25V to 1.05V or 0.95V. Furthermore, whenever the program verify operation is carried out two to six times, the compare voltage can be applied while the compared voltage is lowered by 0.02V to 0.03V.

Furthermore, the whole repetition number of the program verify operation can be divided into n numbers of periods, wherein the compare voltage is applied to respective periods while the compare voltage is lowered so that a target threshold voltage+V1 is applied as the compare voltage in the first period, a target threshold voltage+V2 lower than V1 is applied as the compare voltage in the second period, and a target threshold voltage is applied as the compare voltage in the last $n^{th}$ period. At this time, the target threshold voltage can be 0.8V to 1.2V.

A method of programming a flash memory device according to another embodiment of the present invention includes a program step of programming memory cells, a verify step of verifying a program state of the memory cells, a program re-execution step of again programming program-fail memory cells according to the verify result, and a re-verify step of re-verifying a program state of the entire memory cells including memory cells on which the program operation has been normally performed. In this case, the program re-execution step and the re-verify step are repeatedly performed.

In the above, the program re-execution step and the re-verify step can be repeatedly performed until the program-fail memory cells do not exist.

In the verify step, a threshold voltage of the memory cell and a compare voltage can be compared to verify a program state of the memory cell, wherein the compare voltage can be set higher than a target threshold voltage.

The method can further include a compare voltage-setting step of re-setting a compare voltage used in the re-verify step in order to determine a level of a threshold voltage of the program-fail memory cells according to the re-verify execution number.

The whole repetition number of the re-verify step can be divided into n numbers of periods, wherein the compare voltage is applied to respective periods while the compare voltage is lowered so that a target threshold voltage +V1 is applied as the compare voltage in the first period, a target threshold voltage +V2 lower than V1 is applied as the compare voltage in the second period, and a target threshold voltage is applied as the compare voltage in the last $n^{th}$ period.

Furthermore, whenever the re-verify operation is carried out two to six times, the compare voltage can be applied while the compared voltage is lowered by 0.02V to 0.03V.

The program re-execution step can include re-executing the program while increasing a level of a program voltage applied to the memory cell according to the program execution number. At this time, the program voltage can rise from 16.5V to 19.5V, and can increase by 0.2V to 0.5V according to the program re-execution number.

DETAILED DESCRIPTION OF PREFERRED EMBODIMENTS

Embodiments in accordance with the present invention will be described with reference to the accompanying drawings.

Figure 1:
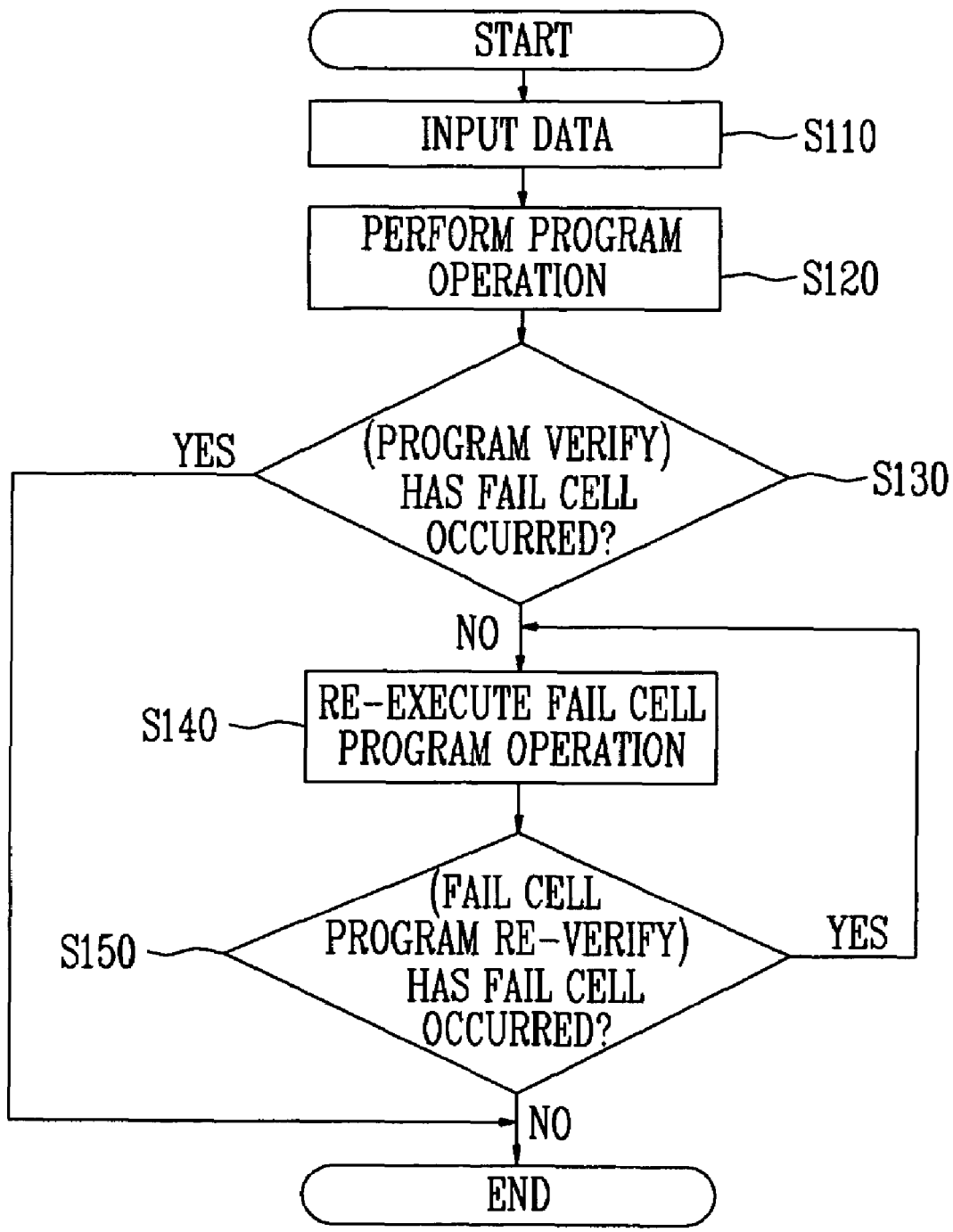
FIG. 1 is a flowchart illustrating steps embodying a method of programming a flash memory device in the related art.
Figure 2:
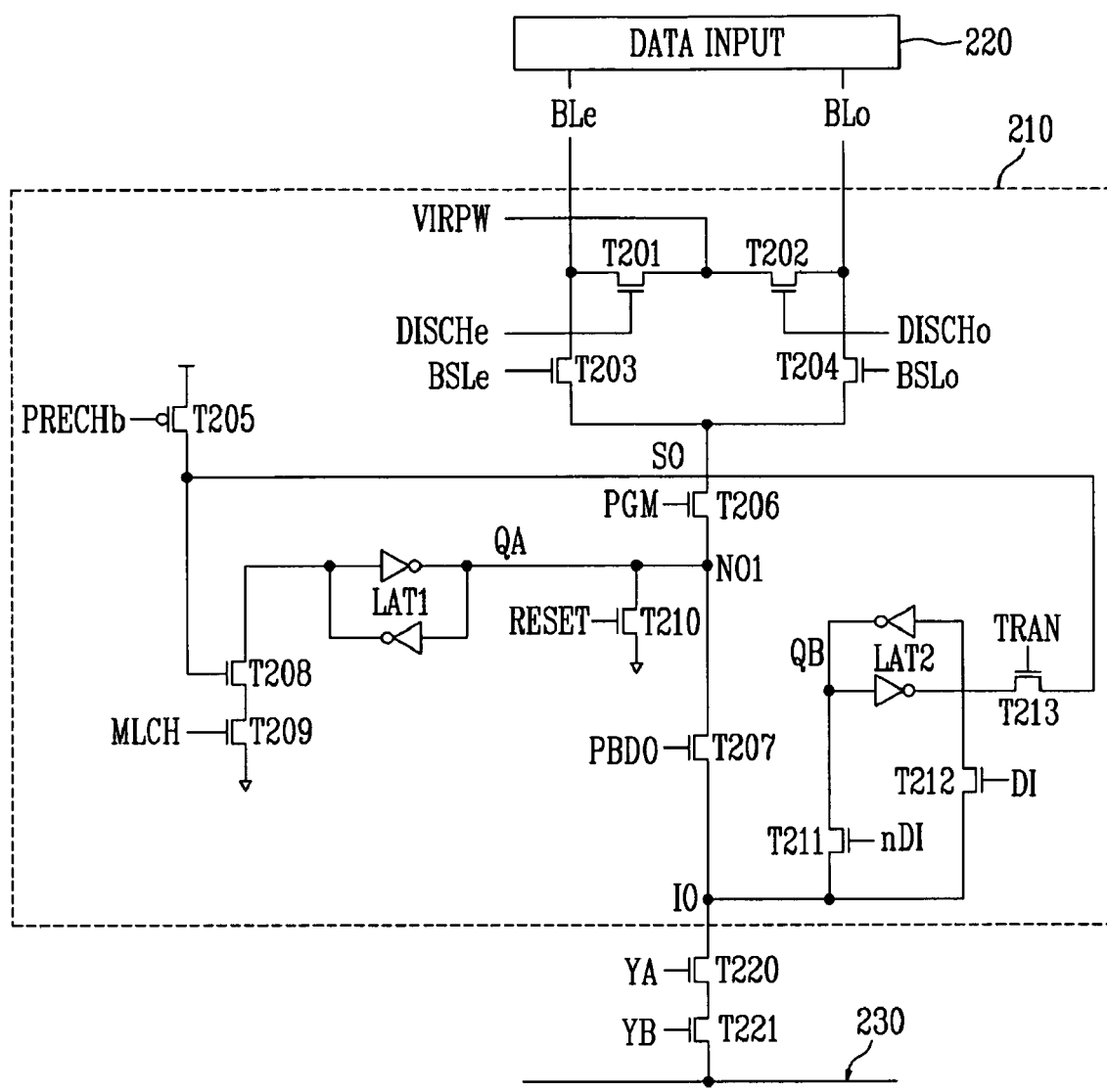
FIG. 2 is a circuit diagram of a page buffer included in a NAND-type flash memory device.
Figure 3:
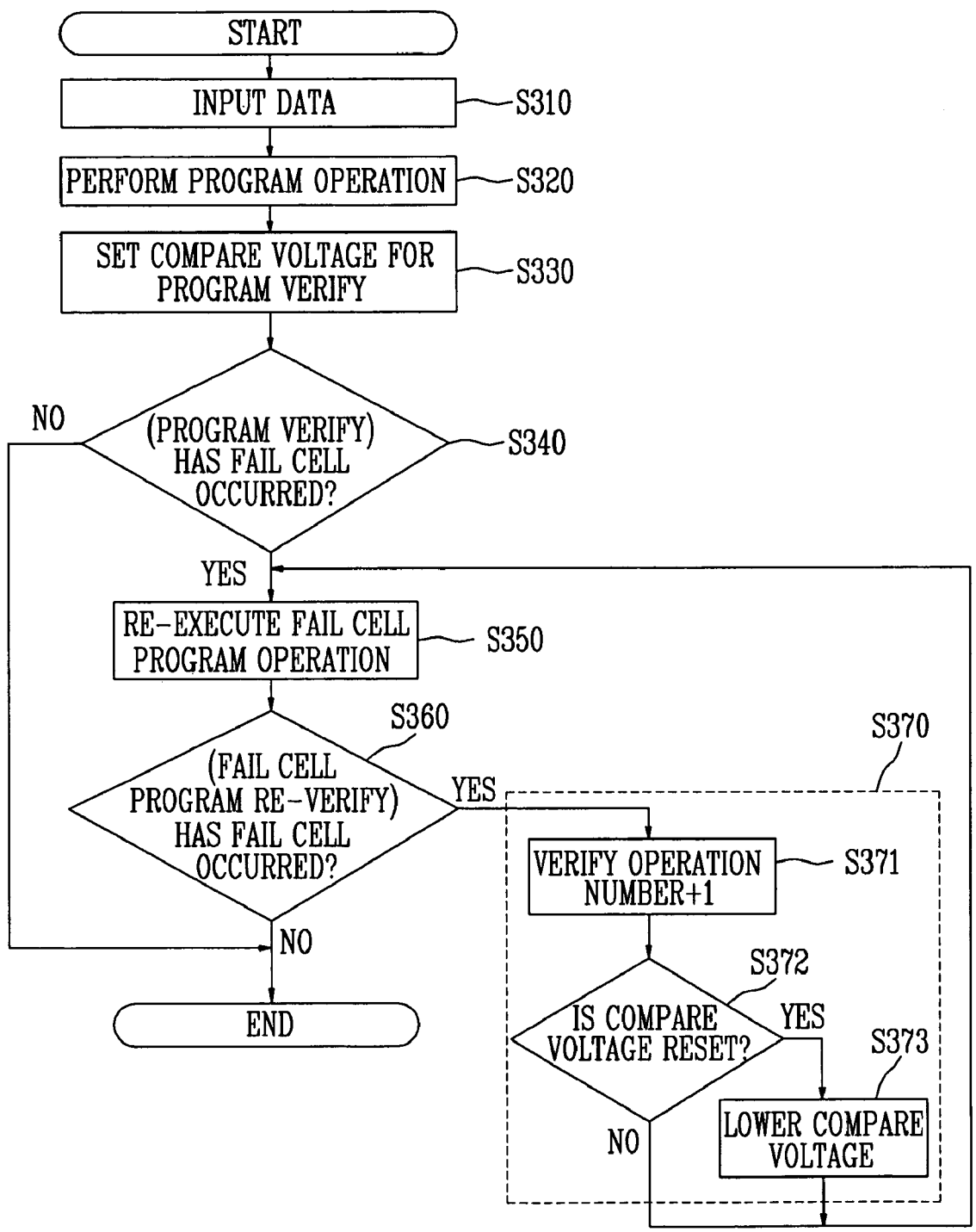
FIG. 3 is a flowchart illustrating steps embodying a method of programming a flash memory device according to an embodiment of the present invention.

FIG. 2 is a circuit diagram of a page buffer included in a NAND-type flash memory device. FIG. 3 is a flowchart illustrating steps embodying a method of programming a flash memory device according to an embodiment of the present invention.

Referring to FIG. 2, the page buffer 210 is connected to bit lines BLe and BLo of a memory cell array 220 having a plurality of memory cells. Transistors T220 and T221 for electrically connecting the page buffer 210 and a data line 230 according to signals (YA and YB) generated depending on column address information are connected between the page buffer 210 and the data line 230.

Constituent elements of the page buffer 210 will be described in detail below.

A bias circuit is connected between the even bit line BLe and the odd bit line BLo. The bias circuit includes first and second transistors T201 and T202. The first and second transistors T201 and T202 are driven according to a first signal (DISCHe) and a second signal (DISCHo), respectively, and transfer a voltage (VIRPW) to the even bit line BLe or the odd bit line BLo.

A third transistor T203 that is driven according to an even bit line select signal (BLSe) is connected between the even bit line BLe and a sensing node SO. The even bit line BLe is electrically connected to the sensing node SO according to the operation of the third transistor T203.

A fourth transistor T204 that is driven according to an odd bit line select signal (BLSo) is connected between the odd bit line BLo and the sensing node SO. The odd bit line BLo is electrically connected to the sensing node SO according to the operation of the fourth transistor T204.

A fifth transistor T205 that is driven according to a precharge signal (PRECHb) is connected between a power supply voltage terminal and the sensing node SO. The fifth transistor T205 precharges the sensing node SO before a memory cell operation (e.g., a read operation).

A sixth transistor T206 that is driven according to a program operation signal (PGM) and a seventh transistor T207 that is driven according to an output control signal (PBDO) are connected between an I/O node IO to or from which data are input or output and the sensing node SO. In this case, the program operation signal (PGM) turns on the sixth transistor T206 so that data stored in a first latch LAT1 corresponding to a main register are transferred to a bit line selected through the sensing node SO at the time of the program operation. The output control signal (PBDO) turns on the seventh transistor T207 so that data, which are read from a memory cell and then stored in the first latch LAT1, are output at the time of a read operation (or a verify operation).

A first terminal of the first latch LAT1, i.e., the main register is connected to a connection node N01 between the sixth and seventh transistors T206 and 207.

An eighth transistor T208 that is driven according to a voltage level of the sensing node SO and a ninth transistor T209 that is driven according to a read control signal (MLCH) are connected between a second terminal of the first latch LAT1 and a ground terminal. The read control signal (MLCH) turns on the ninth transistor T209 when data stored in the second latch LAT2, i.e., an assistant register or the memory cell are stored in the first latch LAT1.

Meanwhile, a tenth transistor T210 is connected between the connection node N01 and the ground terminal. It resets the first latch LAT1 according to a reset signal (RESET).

An eleventh transistor T211 that is driven according to a tenth signal (nDI) is connected between the I/O node IO and a first terminal of the second latch LAT2 corresponding to the assistant register. A twelfth transistor T212 that is driven according to an eleventh signal (DI) is connected between the I/O node I0 and a second terminal of the second latch LAT2. In the program operation, data to be stored in a memory cell are first stored in the second latch LAT2 through the eleventh and twelfth transistors T211 and 212 from the I/O node I0 according to the tenth and eleventh signals (nDI, DI). Therefore, the tenth and eleventh signals (nDI, DI) become an input control signal.

A thirteenth transistor T213 that is driven according to a transfer control signal (TRAN) is connected between a second terminal of the second latch LAT2 and the sensing node SO. Data stored in the second latch LAT2 are transferred to the sensing node SO through the thirteenth transistor T213 according to the transfer control signal (TRAN).

Hereinafter, the method of programming the flash memory device according to an embodiment of the present invention will be described in detail with reference to the circuit diagram of FIG. 2 and the flowchart of FIG. 3.

Referring to FIGS. 2 and 3, the programming method according to an embodiment of the present invention includes a data input step (S310), a program operation step (S320), an initial compare voltage setting step (S330), a program verify step (S340), a program operation re-execution step (S350), a program verify re-execution step (S360), and a compare voltage-setting step (S370). These steps will be described below in detail.

In the data input step (S310), data to be stored in a memory cell are input to the page buffer. To be more specific, after the first latch LAT1 is reset by the reset signal (RESET), data to be stored in a memory cell are stored in the second latch LAT2 according to the input control signals (nDI, DI). Thereafter, if the data stored in the second latch LAT2 are transferred to the sensing node SO according to the transfer control signal (TRAN), the data stored in the second latch LAT2 are stored in the first latch LAT1 according to the read control signal (MLCH).

In the program operation step (S320), the data stored in the page buffer are stored in the memory cell. To be more specific, the data stored in the first latch LAT1 are transferred to the even bit line BLe according to the program operation signal (PGM) and the even bit line select signal (BLSe). Thereafter, if a program voltage is applied to a selected word line (not shown) of the memory cell array, the data stored in the first latch LAT1 are programmed into the memory cell.

Meanwhile, the program operation should be carried out in a state where all data stored in the memory cell are erased. As such, the erase operation can be performed before the program operation.

After the program operation, whether data have been normally stored in the memory cell is verified. This is verified by measuring a threshold voltage of the memory cell. At this time, a compare voltage is used in order to measure the threshold voltage. A level of the compare voltage has to be set.

In the initial compare voltage setting step (S330), a compare voltage used to specify a threshold voltage of a programmed memory cell is set. To be more specific, the compare voltage can be set to a target threshold voltage (e.g., 0.8V to 1.2V), but is set higher than the target threshold voltage (e.g., 1.15V to 1.25V). This reason will be described as follows.

In the case where a threshold voltage of a programmed memory cell is slightly higher than a target voltage (e.g., within 0.04V), the threshold voltage of the memory cell can shift due to the interference incurred by a subsequent operation or the operation of peripheral memory cells, and the target threshold voltage can be lowered accordingly. In this case, since data stored in the memory cell are changed, the memory becomes unstable. Therefore, since this memory cell is an unstable memory cell, a compare voltage is set higher than the target threshold voltage in order to consider this memory cell as a program-fail memory cell.

In the program verify step (S340), whether data have been normally stored in the memory cell by means of the program operation is verified. At this time, in the verify operation, a threshold voltage of a programmed memory cell and a compare voltage are compared. If the threshold voltage of the programmed memory cell is higher than the compare voltage, it is determined that the program operation has been normally performed. To the contrary, if the threshold voltage of the programmed memory cell is lower than the compare voltage, it is determined that the program operation has failed. If the program operation of the entire memory cells has been normally completed, the program operation is finished.

To be more specific, if the sensing node SO is precharged according to the precharge signal (PRECHb) and the even bit line BLe is selected according to the even bit line select signal (BLSe), a predetermined voltage is applied to the even bit line BLe. Thereafter, if a compare voltage is applied to a selected word line (not shown) of the memory cell array, the program operation is normally performed. If a threshold voltage of the memory cell is higher than the compare voltage, the memory cell is not turned on and a predetermined voltage (i.e., a voltage of the sensing node SO) applied to the even bit line BLe is kept intact. Thereafter, data are stored in the first latch LAT1 depending on a program state of the memory cell according to the read control signal (MLCH) and a voltage of the sensing node SO. The data stored in the first latch LAT1 are output according to the output control signal (PBDO). It is determined whether the memory cell has been normally programmed based on the output data.

In the program operation re-execution step (S350), the program operation is again performed on program-fail memory cells on which the program operation has not been normally performed. The program re-execution operation can be performed in the same manner as that performed in the program operation step (S320).

Meanwhile, the program voltage applied to the word line of the memory cell array can be controlled according to the program re-execution number. For example, the program voltage can be initially set to 16.5V, and can be then set so that the program voltage of 19.5V is finally applied. At this time, the program voltage can be increased by 0.2V to 0.5V according to the program operation re-execution number. The reason is that since memory cells that are not programmed although the program operation is again executed are ones having a poor program characteristic, they can be programmed by applying a higher program voltage.

In the program verify re-execution step (S360), a program state (data storing state) of memory cells on which the program operation has been normally performed as well as program-fail memory cells on which the program operation has been performed again are allverified once again. At this time, the reason why the memory cells on which the program operation has been normally performed are verified again is that a threshold voltage of the memory cells may have shifted lower due to the interference from the operation of peripheral memory cells.

The re-verify operation can be carried out in the same manner as that performed in the verify step (S340).

If the program operation of the entire memory cells is normally completed, the program operation is finished. If not, the program operation re-execution step (S350) and the program verify re-execution step (S360) are repeatedly performed until the program operation of the entire memory cells is normally completed. At this time, in the case the program verify operation is performed again, the compare voltage can be controlled. The reason can be described as follows.

In the compare voltage-setting step (S370), if program-fail memory cells exist even after the program verify operation is performed again, the compare voltage set higher than the target threshold voltage is set again before the program operation of the fail-memory cell is performed again. This will be described in detail as follows.

For example, memory cells on which programming has been normally performed in a first program operation are not only ones having a good program characteristic, but also ones having a sufficiently high threshold voltage since they have normally experienced even the verify step using the compare voltage set higher than the target threshold voltage. Therefore, if these memory cells are programmed again, a threshold voltage of the memory cells becomes much higher than that of other memory cells, thus being excessively programmed. In this case, a normal erase operation cannot be performed in a subsequent erase operation, or threshold voltage distribution can become irregular.

However, threshold voltages of memory cells that are normally programmed in the first program operation can also be shifted and lowered a little due to the interference caused by a subsequent operation or the operation of peripheral memory cells. In this case, if the threshold voltage is higher than a target threshold voltage, but slightly lower than a compare voltage, the program operation is performed again. Therefore, the threshold voltage of the memory cells can rapidly rise and the memory cells can be excessively programmed accordingly.

Therefore, memory cells having a good program characteristic can be applied with the compare voltage while it is slowly lowered so that they are not considered as program-fail memory cells in a subsequent program re-verify step.

For example, the whole repetition number of the program re-verify step can be divided into n numbers of periods. In this state, compare voltages can be applied to the respective periods while they are lowered so that a target threshold voltage V1 can be applied as the compare voltage in the first period, a target threshold voltage V2 (lower than V1) can be applied as the compare voltage in the second period, and a target threshold voltage can be applied as the compare voltage in the last $n^{th}$ period (S372, S373).

As another example, a compare voltage of 1.15V to 1.25V can be initially applied and a compare voltage of 1.05V to 0.95V can be finally applied. At this time, the compare voltage can be lower by 0.02V to 0.03V whenever the re-verify step is performed two to six times.

If compare voltages are applied based on the above condition, memory cells, which have a good program characteristic and have been normally programmed, can be prevented from being excessively programmed again. Further, since the program operation is performed again on memory cells whose threshold voltage is higher than a target threshold voltage but not sufficiently higher than it, a stabilized program characteristic and uniform threshold voltage distribution can be secured.

This compare voltage-setting step (S370) can be carried out between the program operation re-execution step (S350) and the program verify re-execution step (S360).

As described above, according to the present invention, after a program operation is completed, a program verify operation is repeatedly performed, wherein a threshold voltage of a programmed memory cell is also detected. If there are memory cells whose threshold voltage becomes low as a result of the detection, the program operation is again performed on a corresponding memory cell. It is thus possible to obtain a uniform distribution characteristic of a threshold voltage.

Furthermore, a program verify operation is performed with a compare voltage being set higher than a target voltage initially so that a threshold voltage of a memory cell is sufficiently higher than the target voltage. The program verify operation is again performed while lowering the compare voltage according to the repetition number. It is thus possible to prevent normally programmed cells from being again excessively programmed.

Although the foregoing description has been made with reference to the described embodiments, it is to be understood that changes and modifications of the present invention may be made by those with the ordinary skilled in the art without departing from the spirit and scope of the present invention and appended claims.

What is claimed is:

1. Method of programming a flash memory device, comprising the steps of:
   (a) performing a first program operation so that each threshold voltage of flash memory cells becomes higher than a target threshold voltage;
   (b) establishing a comparative voltage higher than the target threshold voltage;
   (c) performing a first program verification operation by which each threshold voltage of the memory cells is compared to the comparative voltage to verify whether the memory cells are programmed;

(d) if flash memory cells have a threshold voltage lower than the comparative voltage, performing a second program operation so that the detected flash memory cells have a threshold voltage higher than the comparative voltage;

(e) performing a second program verification operation for determining whether each threshold voltage of the memory cells is higher than the comparative voltage by comparing the comparative voltage with each threshold voltage of the memory cells;

(f) lowering the comparative voltage; and (g) repeating the steps of (d) and (e) so that all of the flash memory cells have a threshold voltage higher than the comparative voltage.

2. The method of claim 1, wherein a program voltage applied to the flash memory cells is raised whenever the second program operation is performed.

3. The method of claim 2, wherein the program voltage is raised to approximately 19.5 V from approximately 16.5 V.

4. The method of claim 3, wherein the program voltage is raised in the range of approximately 0.2 V to approximately 0.5 V whenever the second program operation is performed.

5. The method of claim 1, wherein the comparative voltage is dropped to approximately 0.95 V~1.05 V from approximately 1.15 V~1.25 V.

6. The method of claim 5, wherein the comparative voltage is dropped in the range of approximately 0.02 V to 0.03 V whenever the second program verification operation is performed twice to six times.

7. The method of claim 1, wherein the target threshold voltage is established in the range of approximately 0.8 V to 1.2 V.

8. Method of programming a flash memory device, comprising the steps of:

(a) performing a first program operation so that each threshold voltage of flash memory cells becomes higher than a target threshold voltage;

(b) establishing a comparative voltage higher than the target threshold voltage;

(c) performing a first program verification operation by which each threshold voltage of the memory cells is compared to the comparative voltage to verify whether the memory cells are programmed;

(d) raising a program voltage applied to the flash memory cells at a first voltage;

(e) if flash memory cells have a threshold voltage lower than the comparative voltage, performing a second program operation using the first voltage so that the detected flash memory cells have a threshold voltage higher than the comparative voltage;

(f) lowering the comparative voltage to a second voltage;

(g) performing a second program verification operation for determining whether each threshold voltage of the memory cells is higher than the second voltage by comparing the second voltage with each threshold voltage of the memory cells; and (h) repeating the steps of (d) through (g) until any flash memory cell having a threshold voltage lower than the second voltage is not detected.

9. The method of claim 8, wherein the program voltage is raised to approximately 19.5 V from approximately 16.5 V.

10. The method of claim 9, wherein the program voltage is raised in the range of approximately 0.2 V to approximately 0.5 V whenever the second program operation is performed.

11. The method of claim 8, wherein the comparative voltage is dropped to approximately 0.95 V~1.05 V from approximately 1.15 V~1.25 V.

12. The method of claim 8, wherein the comparative voltage is dropped in the range of approximately 0.02 V to 0.03 V whenever the second program verification operation is performed twice to six times.

13. The method of claim 8, wherein the target threshold voltage is established in the range of approximately 0.8 V to approximately 1.2 V.

* * * * *